United States Patent [19]
Sugawara

[11] Patent Number: 5,973,963
[45] Date of Patent: Oct. 26, 1999

[54] NONVOLATILE SEMICONDUCTOR MEMORY

[75] Inventor: Hiroshi Sugawara, Tokyo, Japan

[73] Assignee: NEC Corporation, Tokyo, Japan

[21] Appl. No.: 09/016,839

[22] Filed: Jan. 30, 1998

[30] Foreign Application Priority Data

Jan. 30, 1997 [JP] Japan ................................. 9-016602

[51] Int. Cl.$^6$ ................................................. G11C 16/00
[52] U.S. Cl. ............................... 365/185.23; 365/230.06
[58] Field of Search ........................ 365/185.23, 189.11, 365/185.28, 185.29, 230.06

[56] References Cited

U.S. PATENT DOCUMENTS

| | | | |
|---|---|---|---|
| 5,265,052 | 11/1993 | D'Arrigo et al. | 365/185.23 |
| 5,287,536 | 2/1994 | Schreck et al. | 365/185.23 |
| 5,365,479 | 11/1994 | Hoang et al. | 365/185.23 |
| 5,396,459 | 3/1995 | Arakawa | 365/185.23 |
| 5,455,789 | 10/1995 | Nakamura | 365/185.23 |
| 5,661,683 | 8/1997 | Song | 365/185.23 |

FOREIGN PATENT DOCUMENTS

| | | |
|---|---|---|
| 6-215591 | 8/1994 | Japan . |
| 8-51351 | 2/1996 | Japan . |

*Primary Examiner*—Tan T. Nguyen
*Attorney, Agent, or Firm*—Foley, Hoag & Eliot LLP

[57] ABSTRACT

There is provided a nonvolatile semiconductor memory which can simplify a circuit structure of a row decoder circuit to minimize an increase in chip size, and selectively supply a negative voltage to a word line. The nonvolatile semiconductor memory has a row decoder circuit section for selecting one of word lines in a memory cell array in response to an input address, and outputting a negative voltage or high voltage to the selected word line in accordance with a selected mode while outputting a ground potential to non-selected word lines. In such a nonvolatile semiconductor memory, each of predecoders comprises supply voltage-high voltage and ground-negative voltage converting circuits for converting the output levels into levels of supply voltage-high voltage and ground-negative voltage respectively in response to the input address, high-voltage and negative-voltage drivers for outputting from the first and second terminals the high voltage or the negative voltage in accordance with each output from these converting circuits, and a select address driver for outputting a voltage activated by the outputs of the voltage drivers and switched by the selected mode.

19 Claims, 10 Drawing Sheets

FIG. 10

NONVOLATILE SEMICONDUCTOR MEMORY

BACKGROUND OF THE INVENTION

1. Field of the Invention

The present invention relates to a nonvolatile semiconductor memory, and in particular, to a negative-voltage row-decoder circuit in a flash EEPROM (Electrically Erasable/Programmable Read Only Memory).

2. Description of the Related Art

When writing or erasing data into or from a flash EEPROM with memory cells each having a floating gate, application of a negative voltage to a gate of a memory transistor is a very important technique in attaining low voltage and high reliability of the device. If the writing or erasing of data is done in a small unit of capacity, a row decoder circuit to supply only a selected word line with a negative or high voltage is required.

Figure 1A:
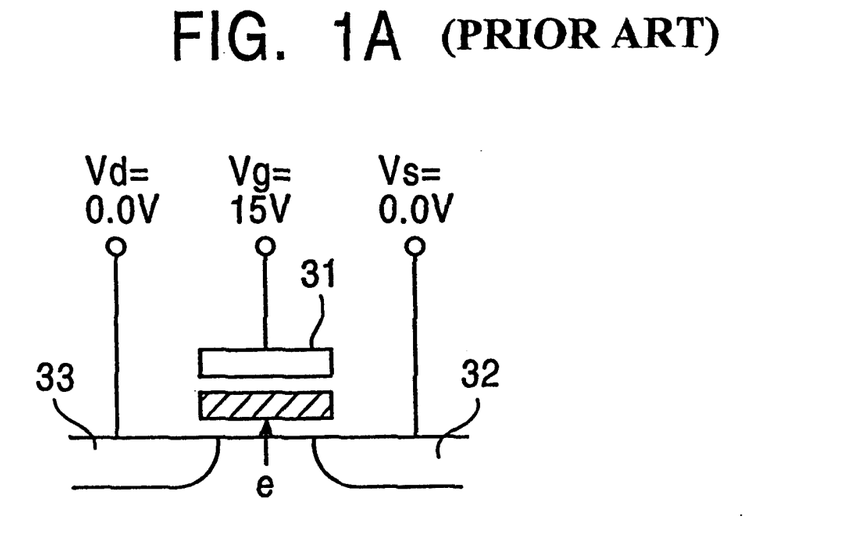
FIG. 1A is a schematic sectional view for explaining erase and write operations of a conventional memory cell.
Figure 1B:
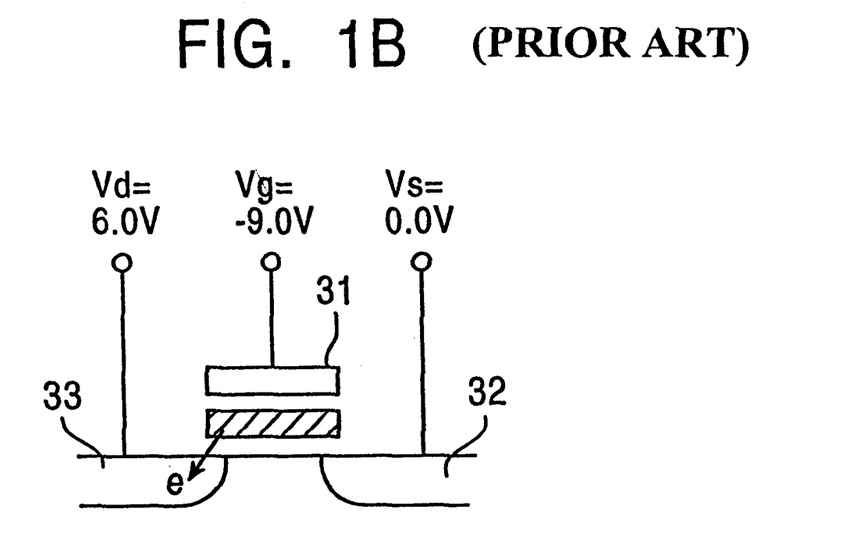
FIG. 1B is a schematic sectional view for explaining write operation of the memory cell.

Now, description is made as to memory cells in such a flash EEPROM. Table 1 shows exemplary conditions of bias voltage applied to respective terminals of a memory cell when erase and write operations are performed by using Fowler-Nordheim tunnel current. FIGS. 1A and 1B are schematic sectional views of the memory cell in the respective operations. In read-out operation, a control gate 31 is supplied with 5.0 V, a drain 33 with 1.0 V and a source 32 is grounded, so that a current flowing through the memory cell is sensed. In erase operation, a voltage of 15 V (Vg) is applied to the control gate 31, and the drain and the source are grounded, as shown in FIG. 1A, where electrons are injected from the substrate into the control gate 31. In write operation, a voltage of –9.0 V (Vg) is applied to the control gate 31, 5.0 V (Vd) to the drain 33 and the source 32 is grounded, as shown in FIG. 1B, where electrons escape from the control gate 31 and enter the drain 33.

TABLE 1

|  | Vcg | Vd | Vs | VH | VL |
|---|---|---|---|---|---|
| Read-Out | 5.0 V/0.0 V | 1.0 V/0.0 V | 0.0 V | 5.0 V | 0.0 V |
| Erase | 15.0 V/0.0 V | 0.0 V/0.0 V | 0.0 V | 15.0 V | 0.0 V |
| Write | –9.0 V/0.0 V (Select/Non-Select) | 6.0 V/0.0 V (Select/Non-Select) | 0.0 V | 3.0 V | –9.0 V |

Figure 2:
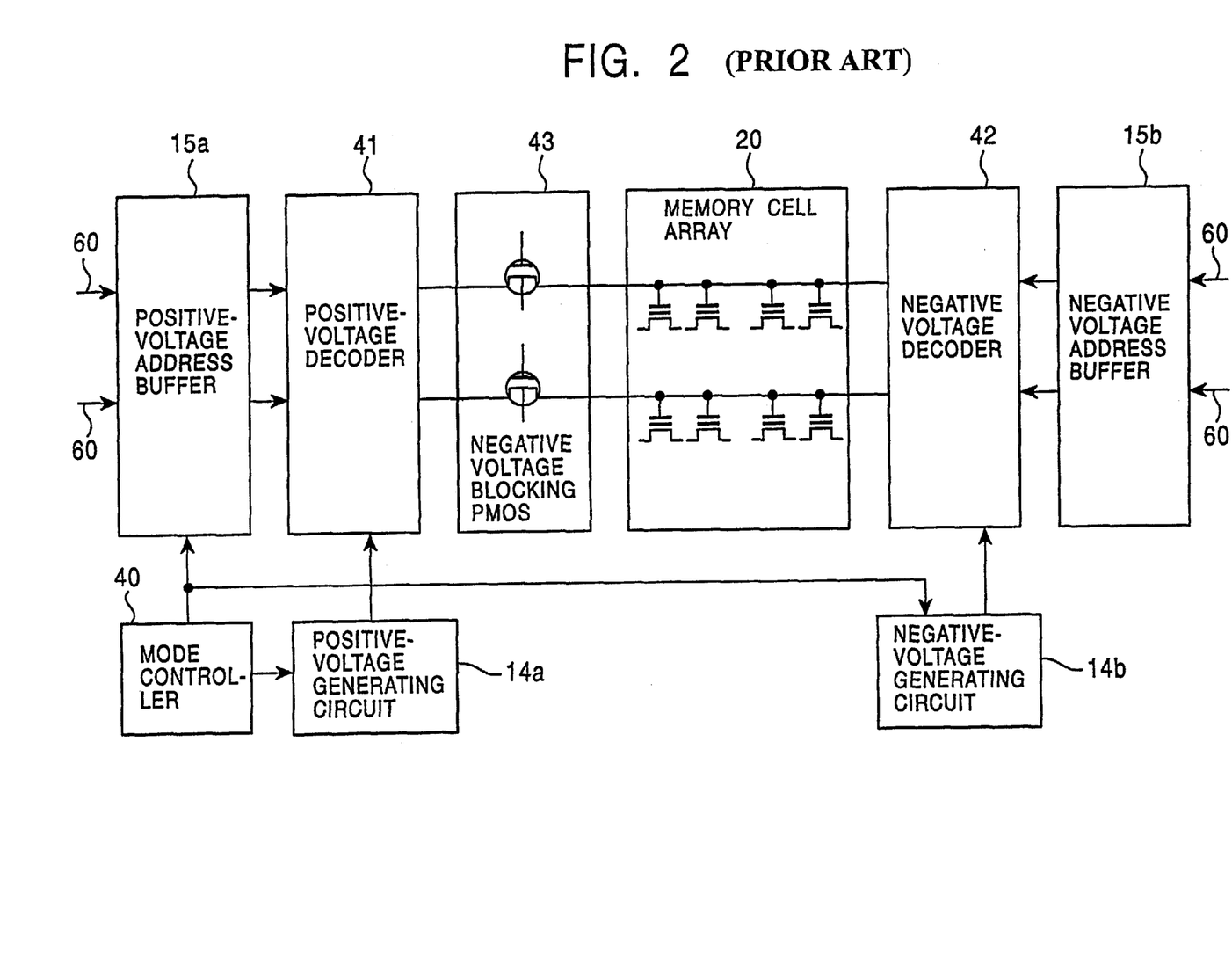
FIG. 2 is a block diagram of a main decoder in a conventional row decoder circuit.

FIG. 2 is a block diagram of a conventional row decoder circuit which satisfies the conditions of bias voltage applied to the control gate of a memory cell. The row decoder circuit is provided with a positive voltage decoder 41 for each word line so that erase and read-out operations will be performed for each word line, and a negative voltage decoder 42 for supplying a negative voltage to only a selected word line during write operation. The row decoder circuit also includes a P-channel transistor 43 for separating the positive voltage decoder 41 from the negative voltage decoder 42.

Since the row decoder circuit of FIG. 2 needs the negative voltage decoder 42 for supplying a negative-voltage to each word line when writing data and the P-channel transistor 43 for blocking the negative voltage, the area of the row decoder circuit becomes very large to prevent high integration of the circuit and hence to increase the chip size.

Figure 3:
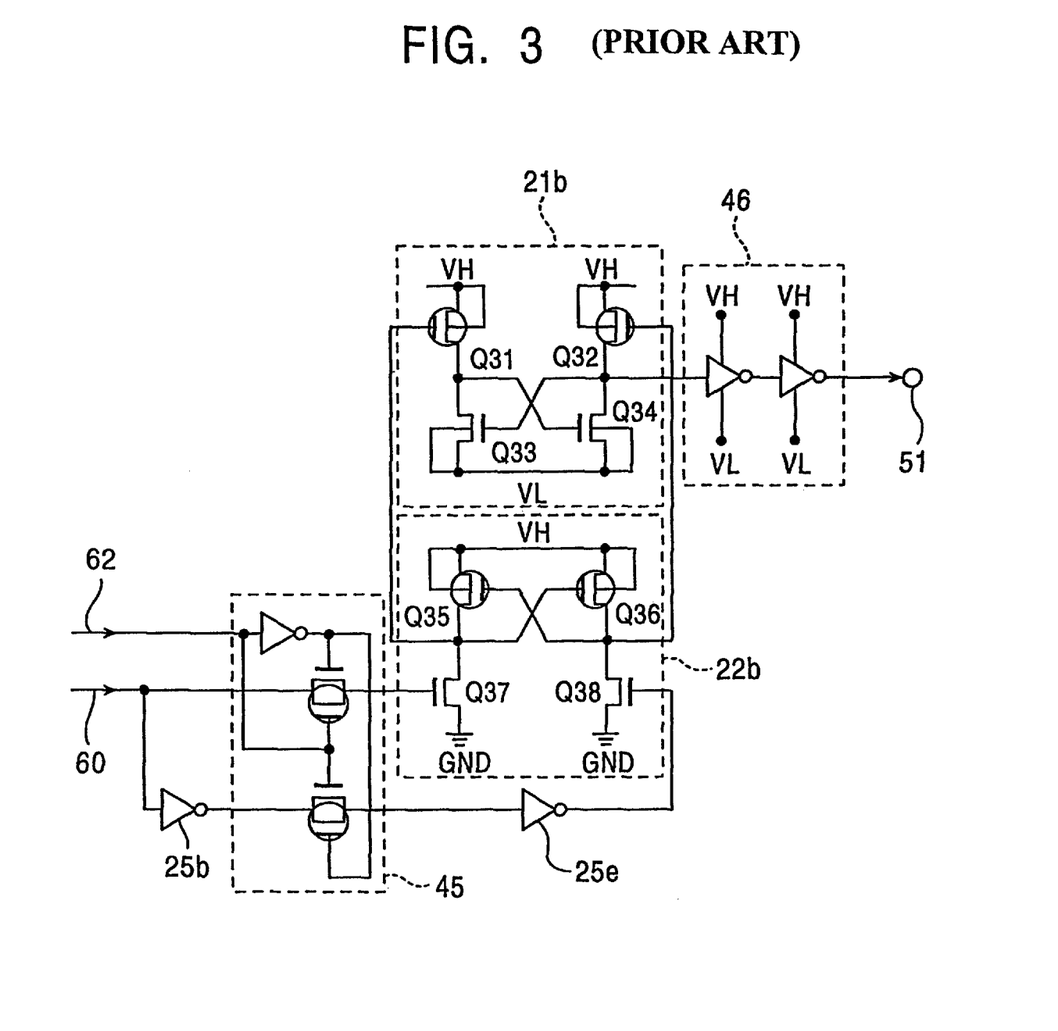
FIG. 3 is a circuit diagram of the main decoder in the row decoder circuit of FIG. 2.

FIG. 3 is a circuit diagram of a negative voltage row decoder disclosed in Japanese Patent Laid-Open Appliction No. Hei 06-215591, which shows another conventional example. In FIG. 3, an input address signal is passed through an inverter 25b and handled as a complementary signal. And, using two transfer gates to be controlled by a write signal 62, the logic level of the address is inverted between the write mode and the other modes (erase and read). The address signal is level-converted by an inverter section 46 consisting of two-stage level shifters 21b, 22b and two inverters, and is output as a selected address signal RAI51.

The level shifters 21b, 22b consist of two P-channel transistors and two N-channel transistors, respectively. In the level shifter 22b, each source of P-channel transistors Q35, Q36 is connected to a potential VH, and each source of N-channel transistors Q37, Q38 is grounded. In the level shifter 21b, each source of P-channel transistors Q31, Q32 is connected to the potential VH, and each source of N-channel transistors Q33, Q34 is connected to a potential VL. The two inverters are supplied with the potentials VH and VL respectively. The potential VH is a high potential (e.g., 15 V) during erase operation, which is supplied from an internal power generating circuit, and a power source potential VCC in the other modes. The potential VL is a negative potential (e.g., –9 V) during write operation and a ground potential in the other modes. Thus, the address signal is converted by the level shifter 22b into a VH-GND potential type signal, and in turn, by the level shifter 21binto a VH-VL potential type signal. The row decoder circuit having such a structure permits application of negative voltage to only a certain word line during write operation, but needs individual address logic inverting circuits for inverting the logic level of the address between the write mode and the other modes. Since it also outputs the VCC level to non-selected word lines during write operation, it is difficult to maintain the operating conditions as shown in Table 1.

Such conventional nonvolatile semiconductor memories need either positive and negative row decoders for applying a negative voltage to a word line, or an input address logic inverting circuit for inverting the input address signal between write mode and the other modes. Therefore, a problem arises with the conventional nonvolatile semiconductor memories that the number of transistors constituting a row decoder and hence the chip size increases. Further, since the VCC level is output to the non-selected word lines during write operation, the non-selected word lines may be disturbed.

SUMMARY OF THE INVENTION

It is an object of the present invention to provide a nonvolatile semiconductor memory which can simplify a circuit structure of a row decoder circuit to minimize an increase in chip size, and selectively supply a negative voltage to a single word line.

In one aspect of the present invention, there is provided a nonvolatile semiconductor memory including internal power generating circuit for outputting, in response to input of a given external voltage, both a high voltage larger than the input voltage and a negative voltage; a power source switching circuit for switching over between the high voltage and the negative voltage and outputting either of the voltages; a memory cell array arranged in a matrix, where a plurality of memory cell transistors, electrically erasable and writable, are arranged in both row and column directions; and a row decoder circuit section for selecting one of word lines in the memory cell array in response to an input address and outputting to the selected word line an output corresponding to either the negative voltage or the high voltage on the basis of whether the current mode is an erase mode or a write mode while outputting a ground potential to non-selected word lines, the row decoder circuit section comprising:

main decoders for outputting the ground potential and the external potential from selected first and second output terminals respectively in response to the input address while outputting from non-selected first and second output terminals either the external potential and the ground potential when the selected word line has been supplied with the negative voltage, or the high potential and the ground potential when the selected word line has been supplied with the high voltage;

predecoders for outputting the negative potential or the external potential from a selected output terminal in accordance with the input address and the selected mode while outputting the ground potential from non-selected output terminals; and word line drivers for connecting the first and second output terminals of each main decoder with each corresponding output terminal of the predecoders, and outputting the negative potential or the external potential to the selected word line in accordance with the selected mode while outputting the ground potential to the non-selected word lines.

In another aspect of the present invention, the nonvolatile semiconductor memory is such that each of the main decoders comprises supply voltage-high voltage and ground-negative voltage converting circuits for converting the output levels into levels of supply voltage-high voltage and ground-negative voltage respectively in response to the input address, and high-voltage and negative-voltage drivers for outputting the high voltage or the negative voltage from first and second terminals in accordance with each output from these converting circuits, each of the predecoders comprises supply voltage-high voltage and ground-negative voltage converting circuits for converting the output levels into levels of supply voltage-high voltage and ground-negative voltage respectively in response to the input address, high-voltage and negative-voltage drivers for outputting the high voltage or the negative voltage from their first and second terminals in accordance with each output from the converting circuits, and a select address driver for outputting a voltage activated by the outputs of the voltage drivers and switched by the selected mode, and each of the word line driver comprises a first switch to be switched by the first or second output of the main decoder so that an output of the corresponding predecoder will be output, in which each word line driver of the predecoders comprises first N-channel and P-channel transistors of which each source and drain is connected in series between the output of the power source switching circuit and an output terminal of the word line driver, and each gate is connected to each output of the high-voltage driver and the negative voltage driver; and a second N-channel transistor of which the source and drain is connected between the output terminal and the ground, and the gate is connected to a reset signal.

According to such a structure of the present invention, one type of row decoder can be used to supply a selected word line with the high voltage when erasing and reading out data and the negative voltage when writing data while keeping non-selected word lines in the ground potential, so that an increase in chip size can be minimized and the negative voltage can be used. It is therefore possible to reduce the internal supply voltage and hence to attain low voltage and high reliability of the device.

DETAILED DESCRIPTION OF THE PREFERRED EMBODIMENTS

Referring to the accompanying drawings, the present invention will be described in detail below.

Figure 4:
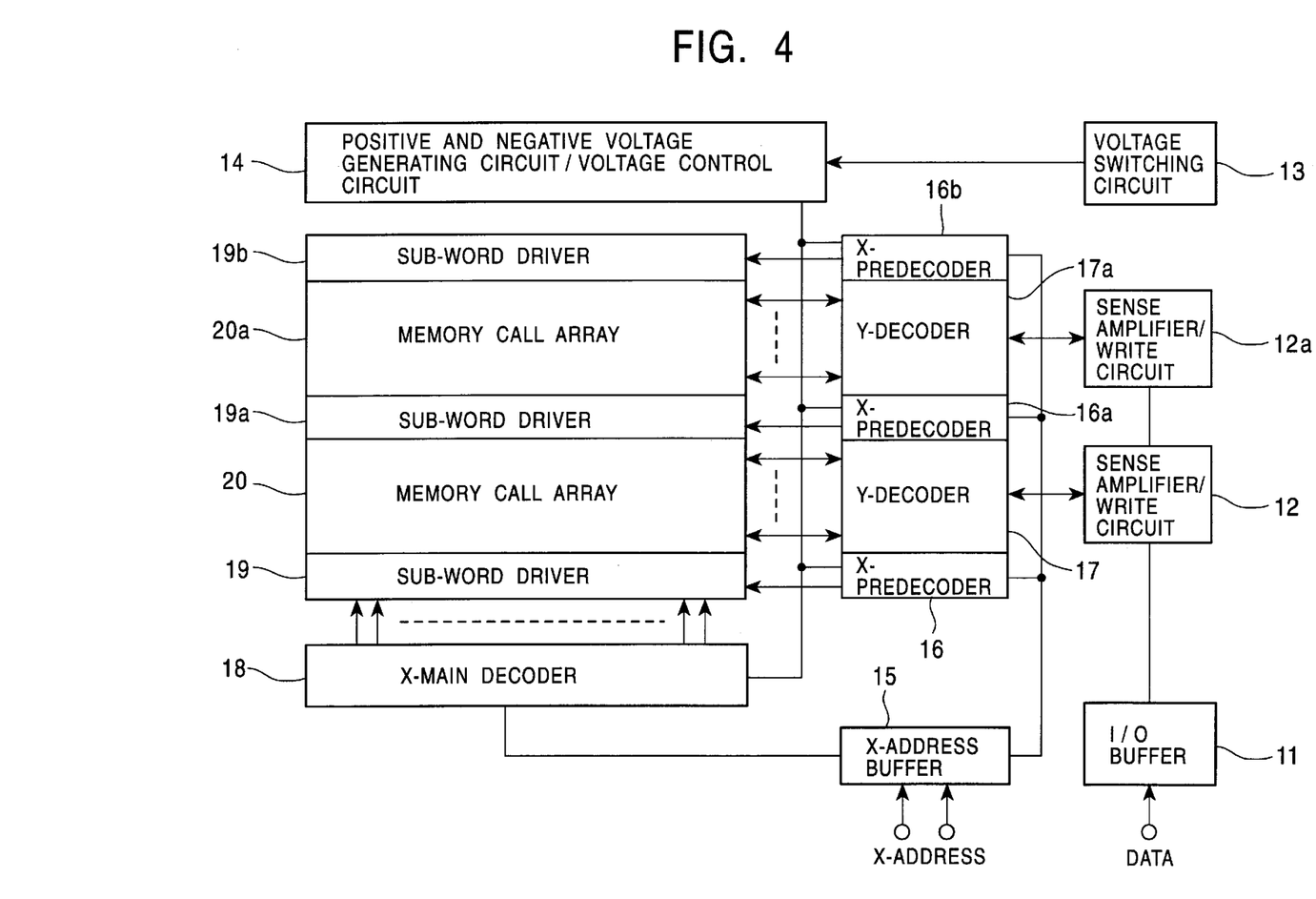
FIG. 4 is a block diagram showing a flash EEPROM used as a semiconductor memory according to an embodiment of the present invention.

FIG. 4 is a block diagram showing a flash EEPROM according to an embodiment of the present invention. The flash EEPROM of the embodiment is constituted of memory cell arrays 20 and 20a arranged in a matrix, an address buffer 15, a main decoder 18, predecoders 16 and 16a, word line drivers 19, 19a and 19b, an I/O buffer 11, sense amplifier/write circuits 12 and 12a, and a positive and negative voltage generating circuit/voltage control circuit 14.

Figure 5:
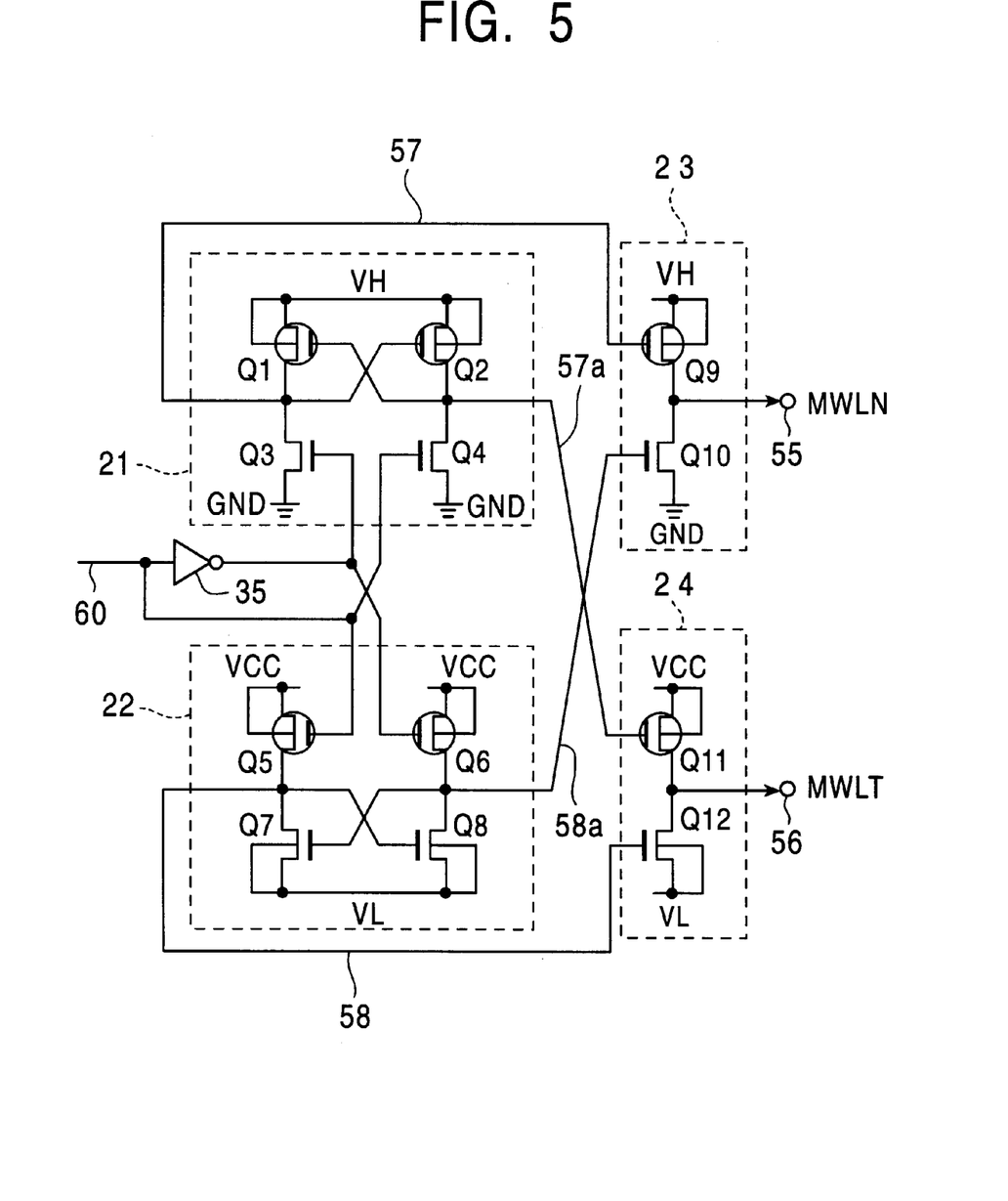
FIG. 5 is a circuit diagram of a main decoder in a row decoder circuit of FIG. 4.

FIG. 5 is a circuit diagram showing the main decoder circuit 18 shown in FIG. 4. The main decoder circuit 18 is constituted of level converting circuits 21, 22 for performing VCC-VH and GND-VL level conversion, and a high voltage driver 23 and a negative voltage driver 24 for receiving outputs of the level converting circuits 21 and 22, respectively, and driving a main word line to the VH level or VL level.

The VCC-VH level converting circuit 21 consists of P-channel MOS transistors Q1, Q2 and N-channel MOS transistors Q3, Q4. The potential VH from the internal high-voltage generating circuit is applied to the sources of the P-channel transistors Q1 and Q2, and each drain and source of the N-channel transistors Q3, Q4 is connected between each drain of the transistors Q1, Q2 and the ground potential. The gate of the transistor Q1 is connected to a drain-common contact or drain-to-drain node of the transistors Q2, Q4, and the gate of the transistor Q2 is connected to a drain-common contact or drain-to-drain node of the transistors Q1, Q3. An address signal is supplied to the transistor Q4 and to the gate of the transistor Q3 through an inverter 35. In such a structure, the VCC-VH level converting circuit 21 outputs an output signal 57 from the node of the transistors Q1, Q3, and an output signal 57a from the node of the transistors Q2, Q4. From these output signals LS1O/LS1O, an "L" level is converted into the GND level and an "H" level into the high-voltage VH level.

The GND-VL level converting circuit 22 consists of P-channel MOS transistors Q5, Q6 and N-channel MOS transistors Q7, Q8, with the sources of the transistors Q5, Q6 connected to the potential VCC, and each drain and source of the N-channel transistors Q7, Q8 connected between each drain of the transistors Q5, Q6 and the potential VL. The gate of the transistor Q7 is connected to a drain-common contact or drain-to-drain node of the transistors Q6, Q8, and the gate of the transistor Q8 is connected to a drain-common contact or drain-to-drain node of the transistors Q5, Q7. The address signal is input to the gate of the transistor Q5 and to the gate of the transistor Q6 through the inverter 35. The GND-VL level converting circuit 22 outputs an output signal 58 from the node of the transistors Q5, Q7, and an output signal 58a from the node of the transistors Q6, Q8. From the output signals 58, 58a, the "H" level is kept in the potential VCC and the "L" level is converted into the negative voltage VL.

The high voltage driver 23 consists of a P-channel transistor Q9 and an N-channel transistor Q10, with the source of the transistor Q9 connected to the high voltage VH, and the drain and source of the transistor Q10 connected between the drain of the transistor Q9 and the GND. The negative voltage driver 24 consists of a P-channel transistor Q11 and an N-channel transistor Q12, with the source of the transistor Q11 connected to the VCC, and the drain and source of the transistor Q12 connected between the drain of the transistor Q9 and the potential VL. The output signal 57 of the VH-VCC level converting circuit 21 is input to the gate of the transistor Q9, and the output signal 58a of the GND-VL level converting circuit 22 is input to the gate of the transistor Q10. Either the potential VL or the GND is thus output as an output signal 55 depending on the logic. On the other hand, the output signal /LS1O from the VH-VCC level converting circuit 21 is input to the gate of the transistor Q11, and the output signal LS2O of the GND-VL level converting circuit 22 is input to the gate of the transistor Q12. Either the VCC or the potential VL is thus output as an output signal 56 depending on the logic.

Figure 6:
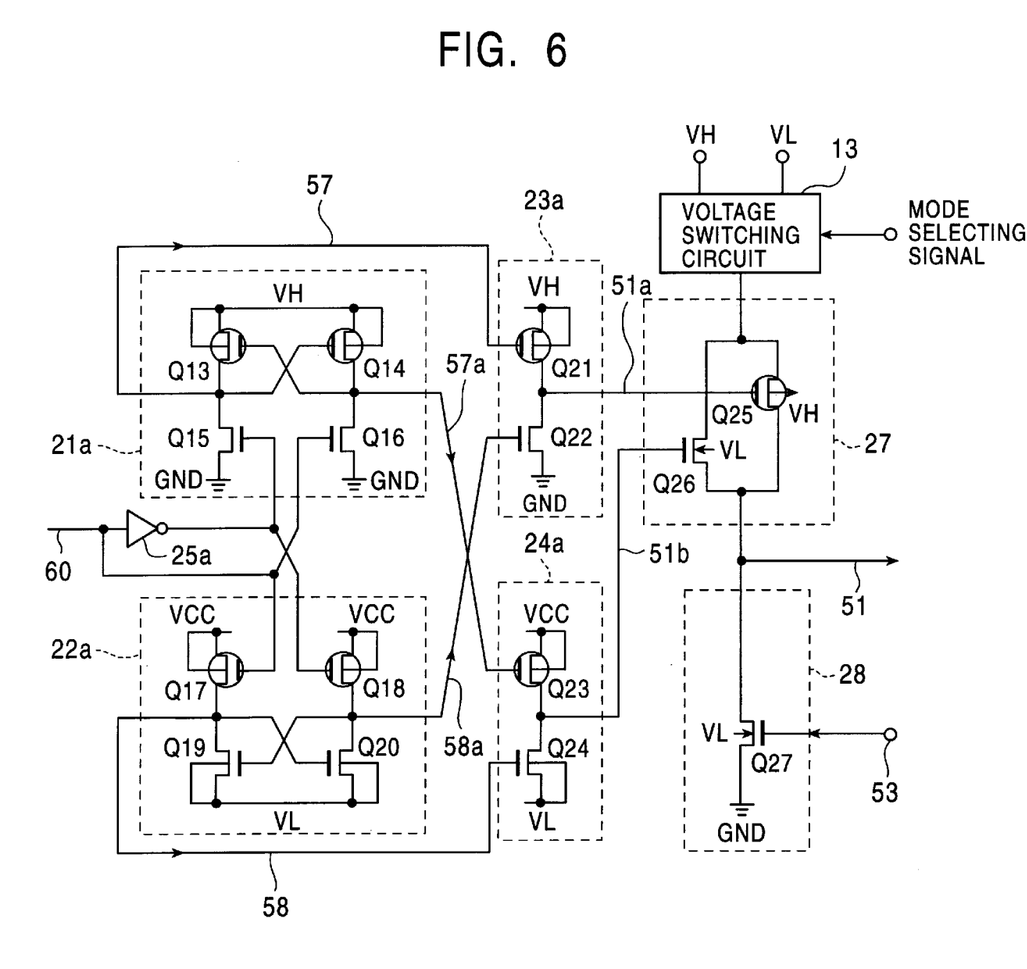
FIG. 6 is a circuit diagram of a predecoder in the row decoder circuit of FIG. 4.

FIG. 6 is a circuit diagram showing the predecoder circuit 16 of FIG. 4.

As is similar to the main decoder circuit, the predecoder circuit is constituted of a level converting circuit 21a for performing VCC-VH (VH>VCC) level conversion, a level converting circuit 22a for performing GND-VL (VL>GND) level conversion, a high voltage driver 23a and a negative voltage driver 24a for driving the level converting circuits 21a and 22a respectively, a select address driver 27 for outputting to a selected address the high voltage VH or the negative voltage VL in accordance with the mode controlled and selected by the high voltage driver 23a and the negative voltage driver 24a, and a reset driver 28 for resetting a selected voltage to the GND level at the time of reset. The high voltage level converting circuit 21a, the negative voltage level converting circuit 22a, the high voltage driver 23a and the negative voltage driver 24a have the same structure as those in the main decoder circuit 18. In such a structure, the high voltage driver 23a outputs a select address control signal 51a and the negative voltage driver 24a outputs a select address control signal 51b.

The select address driver 27 consists of a P-channel transistor Q25 and an N-channel transistor Q26, with the drain of the transistor Q25 connected to a voltage switching circuit 13 for switching the output of this driver 27 to either the high voltage VH or the voltage VL according to a mode selecting signal, and the sources of the transistors Q25, Q26 connected to a select address signal 51 (RAI). The output signal 51a of the high voltage driver 23a is input to the gate of the transistor Q25, and the output signal 51b of the negative voltage driver 24a is input to the gate of the transistor Q26.

The reset driver 28 has an N-channel transistor Q27 connected between the select address signal 51 and the GND. In such a structure, a reset signal 53 indicative of the VL-VCC level is input to the gate of the transistor Q27 and thus the select address signal 51 is reset to the GND.

Figure 7:
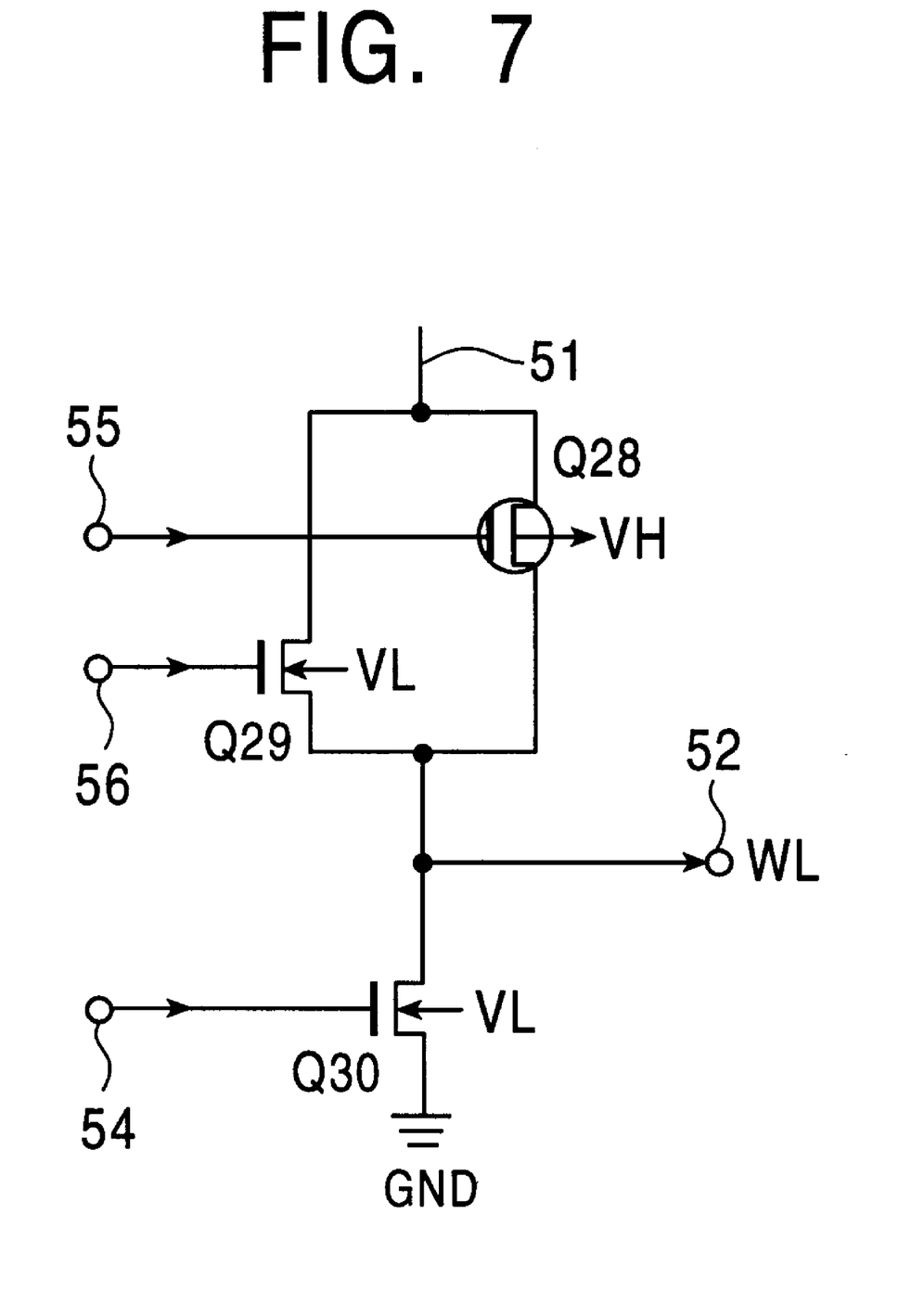
FIG. 7 is a circuit diagram of a sub-word (word line) driver in the row decoder circuit of FIG. 4.

FIG. 7 is a circuit diagram showing a structure of the word line driver 19 of FIG. 4.

The word line driver 19 consists of a P-channel transistor Q28 and an N-channel transistor Q29, each source and drain of which is connected between the select address signal 51 (RAI) from the predecoder circuit 16 and a word line 52, and an N-channel transistor Q30 the drain and source of which is connected between the word line 52 and the GND. The output signals 55 and 56 of the main decoder circuit 18 are input to the gate of the transistor Q28 and the gate of the transistor Q29, respectively, and thus the output signal 51 of the predecoder circuit 16 is transferred to the word line 52. When a reset signal 54 of the VL-VCC level is input to the gate of the transistor Q30, the word line WL is reset to the GND.

Figure 8:
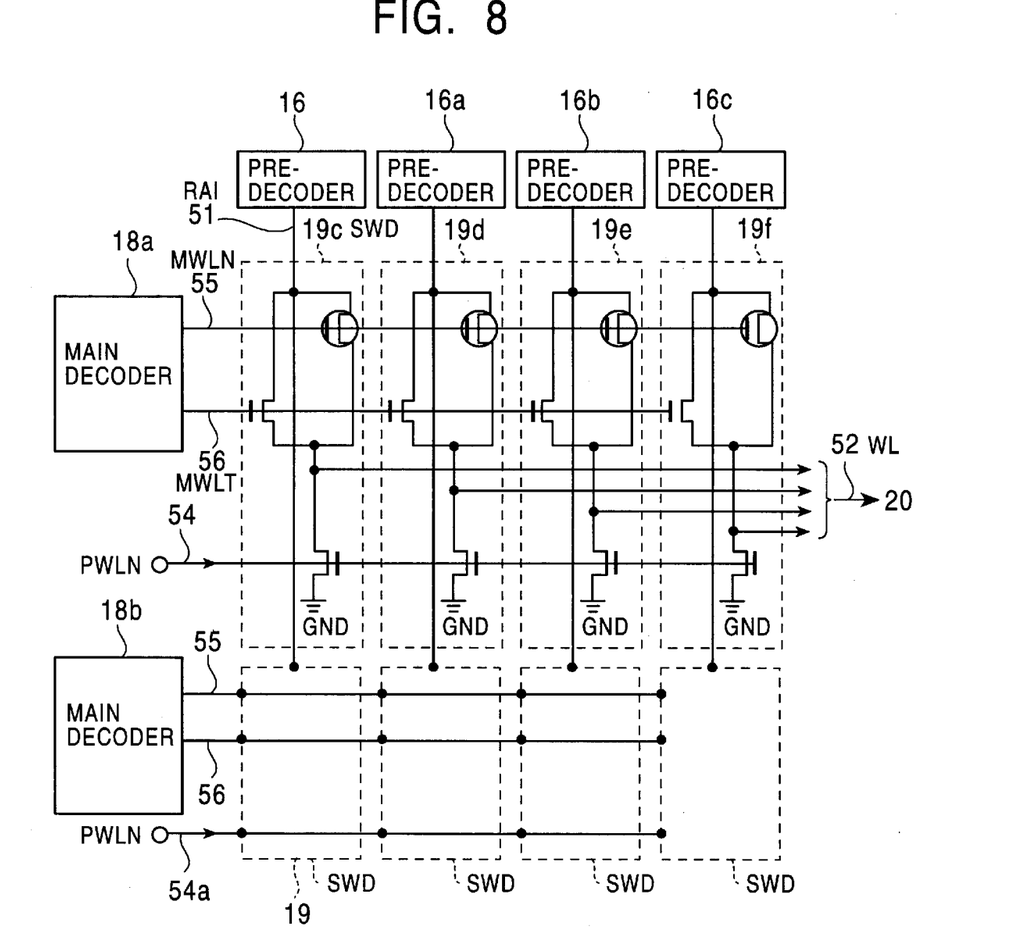
FIG. 8 is a block diagram for explaining word-line select operation of the row decoder circuit of FIG. 4.
Figure 9:
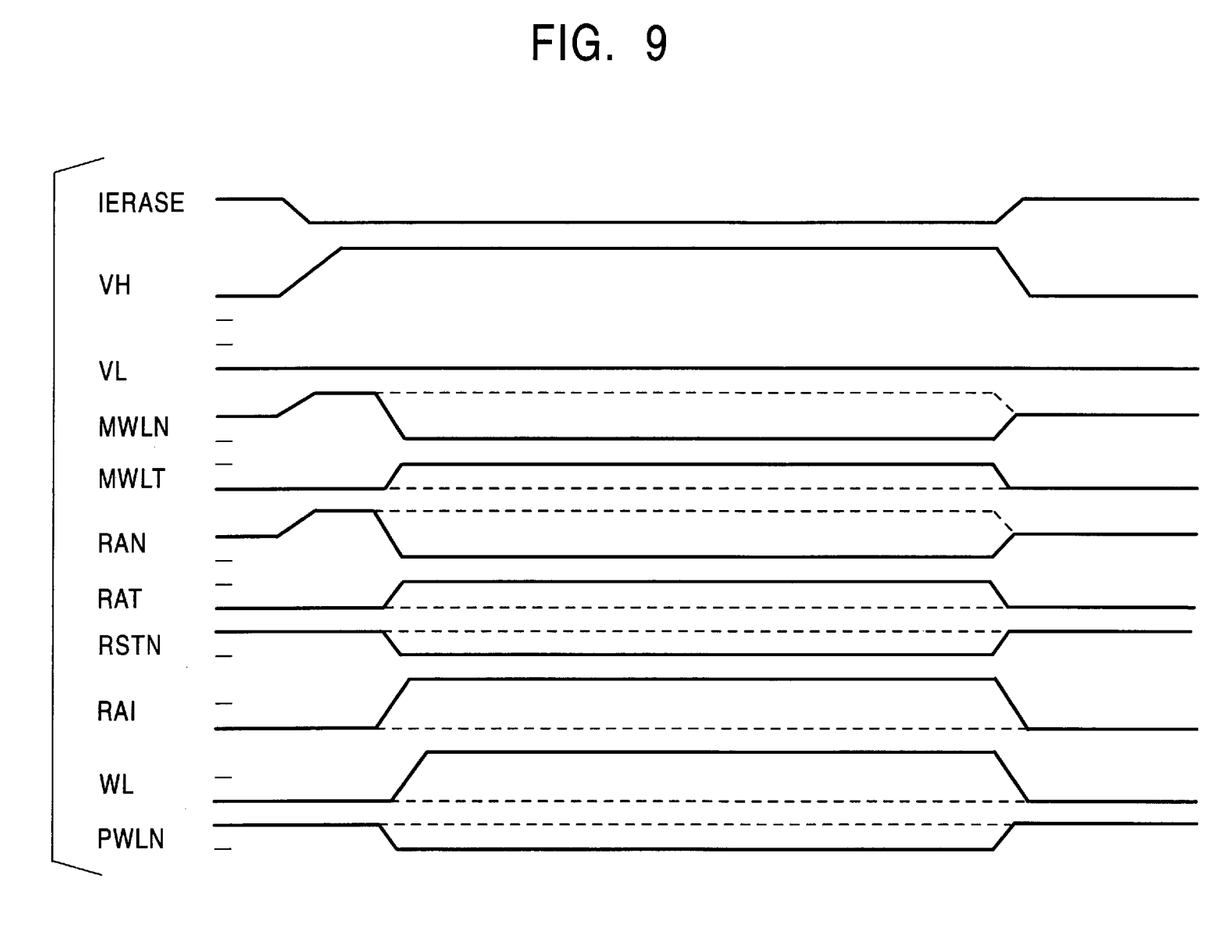
FIG. 9 is a timing chart for explaining erase operation of the row decoder circuit of FIG. 4.
Figure 10:
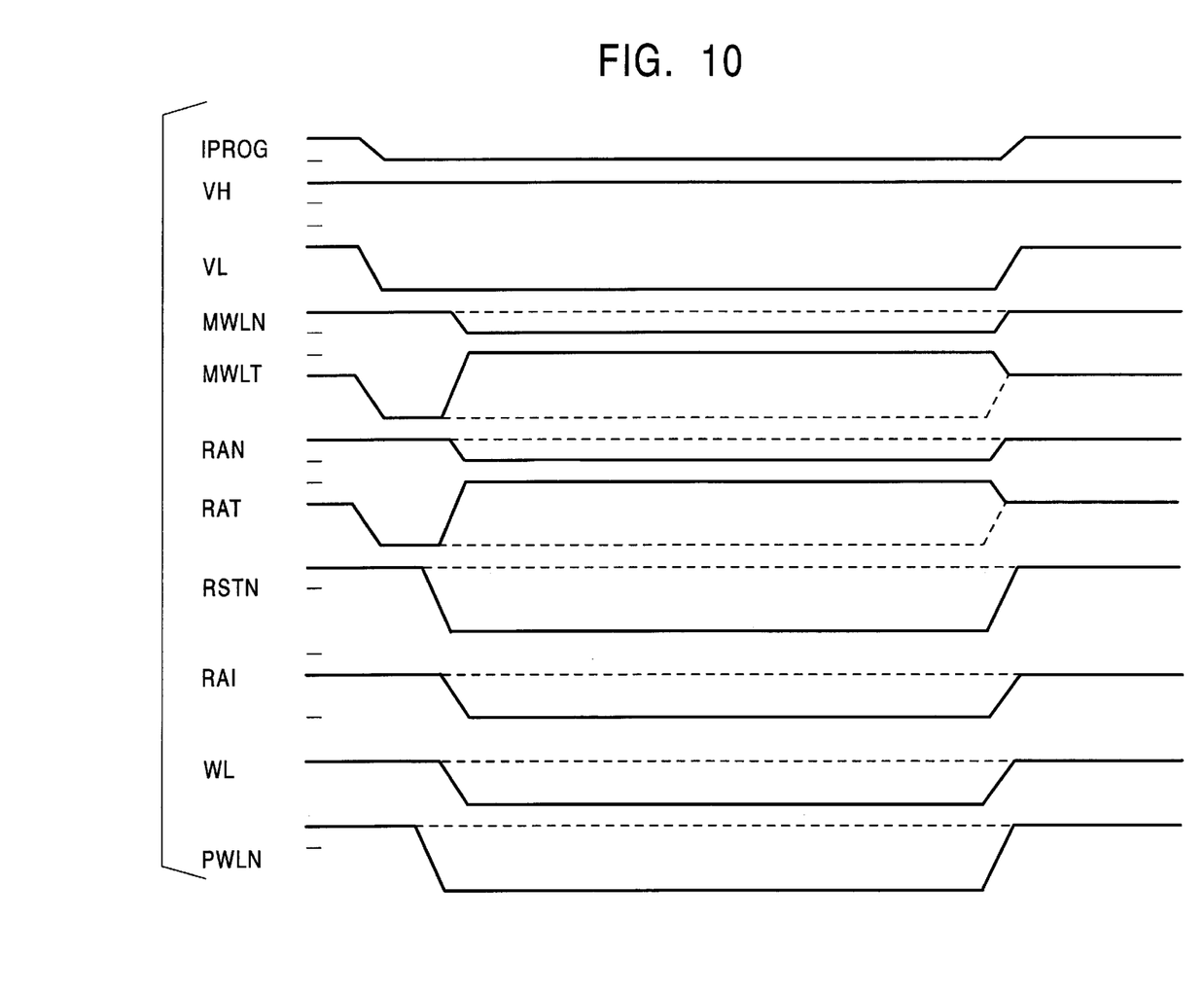
FIG. 10 is a timing chart for explaining write operation of the row decoder circuit of FIG. 4.

Now, description is made as to word-line selecting operation in the embodiment with reference to a schematic block diagram of FIG. 8 and timing charts of FIGS. 9 and 10.

The output signals 55 and 56 of one main decoder 18 are connected to a plurality of word line drivers 19 (four in the drawing). The output signal RAI of a respective predecoder 16 is connected to each of the word line drivers 19. The output signal RAI of the respective predecoder 16 is also connected to a corresponding one of the word line drivers 19 connected to another main decoder 18a.

At first, FIG. 9 shows operation in an erase mode. When an erase signal 61 is activated, the potential VH (e.g., 15 V) is generated from the internal voltage generating circuit. The potential VL is kept in the GND level. At this time, the output signal 55 of the main decoder 18 and the output signal 51a of the high voltage driver 23a in the predecoder 16 are pulled up to the potential VH. After that, when one of address signals, input by an external address signal 60 to the main decoder circuits 18 and predecoder circuits 16, is activated, the output signals 55 and 56 of a selected main decoder circuit 18 are converted into the GND and VCC levels respectively by the level converting circuits 21 and 22, and input to corresponding word line driver circuits 19. As is similar to the main decoder circuit 18, only the level converting circuits 21a and 22a in a selected one of the predecoder circuits 16 perform level conversion, where the output 51a of the high voltage driver 23a and the output 51b of the negative voltage driver 24a are converted into the GND and VCC levels, respectively, and the select address signal 51 is supplied with the potential VH output from the voltage switching circuit 13.

The output signals 55, 56 of the selected main decoder 18 and the select address signal 51 pulled up to the VH level in the selected predecoder 16 are passed through the word line driver circuits 19, and the outputs of the word line driver circuits 19 are driven by the word line reset signal 54 from the vcc level to the GND level. Thus only one word line 52 is driven to the potential VH level.

In the word line drivers 19 connected to the other non-selected main decoders 18, the output signals 55 and 56 of each non-selected main decoder 18 are kept in the potential VH level and the GND level, respectively, and the word line reset signal 54 in the VCC. In such conditions, the P-channel and N-channel transistors are turned off in each non-selected word line driver 19 connected to the select address signal 51 so that the non-selected word lines can be kept in the GND level without supply of the potential VH.

From among the word line drivers 19 connected to the selected main decoder circuit 18, those connected to the non-selected predecoders 16 are also kept in the GND level since the output signal 51 of each non-selected predecoder 16 is in the GND.

Although the above description was made as to the case where the erase operation is performed for a single word line, the address buffer circuit can be changed to select outputs RAI of plural predecoder circuits simultaneously so that the erase operation can be performed for plural word lines once in time.

Referring next to FIG. 10, write operation will be described.

When a write signal IPROG62 is activated, the potential VL (e.g., −9 V) is generated from the internal voltage generating circuit. The potential VH is kept in the VCC level. At this time, the output signal 56 of the main decoder circuit 18 and the output signal 51b of the high voltage driver 24a in the predecoder 16 pulled down to the potential VL. After that, when one of address signals, input by the external address signal 60 to the main decoder circuits 18 and predecoder circuits 16,16a, 16b and 16c is activated, the output signals 55 and 56 of a selected main decoder circuit 18 are converted into the GND and VCC levels respectively by the level converting circuits 21 and 22, and input to corresponding word line driver 19. As is similar to the main decoder circuit 18, only the level converting circuits 21a and 22a in a selected one of the predecoder circuits 16 perform level conversion, where the output 51a of the high voltage driver 23a and the output 51b of the negative voltage driver 24a are converted into the GND and VCC levels respectively, and the select address signal 51 is supplied with the potential VL output from the voltage switching circuit 13.

The output signals 55, 56 of the selected main decoder circuit 18 and the select address signal 51 pulled down to the VL level in the selected predecoder 16 are passed through the word line driver 19, and the outputs of the word line driver 19 are driven by the word line reset signal 54 from the VCC level to the GND level. Thus only one word line is driven to the potential VL level.

In the word line drivers 19 connected to the other non-selected main decoders circuits 18, the output signals 55 and 56 of each non-selected main decoder circuit 18 are kept in the VCC level and the GND level respectively, and the word line reset signal 54 in the VCC. In such conditions, the P-channel and N-channel transistors are turned off in each non-selected word line driver 19 connected to the select address signal 51 (RAI) so that the non-selected word lines can be kept in the GND level without supply of the potential VL.

From among the word line drivers 19 connected to the selected main decoder circuit 18, those connected to the non-selected predecoders 16 are also kept in the GND level since the output signal 51 of each non-selected predecoder 16 is in the GND.

As the row decoder circuit is configured such above, one type of decoder circuit can be used to supply a single word line with both a high voltage for erase operation and a negative voltage for write operation. It is therefore unnecessary to provide individual decoder circuits for erase and write operations or an input address logic inverting circuit for the write mode and the other modes, such individual circuits being required in the conventional. Negative-voltage blocking P-channel transistors can also be eliminated from the row decoder circuit. Thus the chip size of the row decoder circuit can be minimized. In addition, the word lines not selected in each mode can be kept in the GND level constantly.

The above description was made as to an FN type flash EEPROM utilizing Fowler-Nordheim tunnel current, where the selected word line was applied with the negative voltage when writing data and the high voltage larger than the external supply voltage when erasing data, but the present invention can also be embodied in a CHE type flash EEPROM for writing data using channel hot electron current, where the selected word line is applied with the high voltage when writing data and the negative voltage when erasing data.

As described above, since the nonvolatile semiconductor memory of the present invention can use one type of row decoder circuit to supply only a selected word line with the high voltage when erasing and reading out data and the negative voltage when writing data while keeping non-selected word lines in the ground potential, the structure of the row decoders can be simplified when compared to the conventional and hence the chip size can be minimized. It is therefore possible to reduce the internal supply voltage and hence to attain low voltage and high reliability of the device.

What is claimed is:

1. A nonvolatile semiconductor memory including internal power generating circuit for outputting, in response to input of a given external voltage, both a high voltage larger than the input voltage and a negative voltage; a power source switching circuit for switching over between the high voltage and the negative voltage and outputting either of the voltages; a memory cell array arranged in a matrix, where a plurality of memory cell transistors, electrically erasable and writable, are arranged in both row and column directions; and a row decoder circuit section for selecting one of word lines in the memory cell array in response to an input address and outputting to the selected word line an output corresponding to either the negative voltage or the high voltage on the basis of whether a current mode is an erase mode or a write mode while outputting a ground potential to non-selected word lines, said row decoder circuit section comprising:

main decoders for outputting the ground potential and the external potential from selected first and second output terminals respectively in response to the input address while outputting from non-selected first and second output terminals either the external potential and the ground potential when the selected word line has been supplied with the negative voltage, or the high potential and the ground potential when the selected word line has been supplied with the high voltage;

predecoders for outputting the negative potential or the external potential from a selected output terminal in accordance with the input address and the selected mode while outputting the ground potential from non-selected output terminals; and word line drivers for connecting the first and second output terminals of each main decoder with each corresponding output terminal of the predecoders, and outputting the negative potential or the external potential to the selected word line in accordance with the selected mode while outputting the ground potential to the non-selected word lines.

2. The nonvolatile semiconductor memory according to claim 1, wherein each of said main decoders comprises supply voltage-high voltage and ground-negative voltage converting circuits for converting the output levels into levels of supply voltage high-voltage and ground-negative voltage respectively in response to the input address, and high-voltage and negative-voltage drivers for outputting the high voltage or the negative voltage from their first and second terminals in accordance with each output from these converting circuits, each of said predecoders comprises supply voltage-high voltage and ground-negative voltage converting circuits for converting the output levels into levels of supply voltage-high voltage and ground-negative voltage respectively in response to the input address, high-voltage and negative-voltage drivers for outputting the high voltage or the negative voltage from their first and second terminals in accordance with each output from the converting circuits, and a select address driver for outputting a voltage activated by the outputs of the voltage drivers and switched by the selected mode, and each of said word line driver comprises a first switch to be switched by the first or second output of the main decoder so that an output of the corresponding predecoder will be output.

3. The nonvolatile semiconductor memory according to claim 2, wherein a second switch circuit for resetting the output signal in response to input of a reset signal is added to the select address driver in said predecoder and said word line driver.

4. The nonvolatile semiconductor memory according to claim 2, wherein each word line driver of said predecoders comprises first N-channel and P-channel transistors of which each source and drain is connected in series between the output of the power source switching circuit and an output terminal of the word line driver, and each gate is connected to each output of the high-voltage driver and the negative voltage driver; and a second N-channel transistor of which the source and drain is connected between the output terminal and the ground, and the gate is connected to a reset signal.

5. A non-volatile semiconductor memory, comprising:
a plurality of memory cell arrays with cells that are driven by word lines having one of: a positive voltage driving signal and a negative voltage driving signal;
a plurality of predecoders, each providing an output signal in response to address selection and mode selection signals provided thereto, wherein said output signal corresponds to one of: said positive voltage driving signal and said negative voltage driving signal;
a plurality of main decoders, each providing first and second switching signals in response to said address selection signal; and
a plurality of word line drivers, coupled to said memory cell arrays, said predecoders, and said main decoders, said word line drivers providing said output signals of said predecoders to said memory cells according to said first and second switching signals.

6. A non-volatile semiconductor memory, according to claim 5, wherein each of said word line drivers includes a first switch, coupled to said first switching signal, and a second switch coupled to said second switching signal and wherein said first switch causes said word line drivers to provide said positive voltage driving signal to said memory cells and said second switch causes said word line drivers to provide said negative voltage driving signal.

7. A non-volatile semiconductor memory, according to claim 6, wherein said first and second switches are transistors.

8. A non-volatile semiconductor memory, according to claim 6, wherein said word line driver also includes a reset switch, coupled to a reset signal line input thereto, said reset switch causing said word line driver to provide an output signal other than said positive and negative voltage driving signals in response to a reset signal being provided on said reset signal line.

9. A non-volatile semiconductor memory, according to claim 6, wherein each of said main decoders includes first and second level converting circuits, coupled to said address select signal, wherein said first level converting circuit is activated in response to said address select signal having a first state and wherein said second level converting circuit is activated in response to said address select circuit having a second state different from said first state.

10. A non-volatile semiconductor memory, according to claim 9, wherein said each of said main decoders also includes a high voltage driver, coupled to said first and second level converting circuits, said high voltage driver providing a value for said first switching signal that varies according to said address select signal and wherein each of said main decoders also includes a low voltage driver, coupled to said first and second level converting circuits, said low voltage driver providing a value for said second switching signal that varies according to said address select signal.

11. A non-volatile semiconductor memory, according to claim 6, wherein each of said predecoders includes first and second level converting circuits, coupled to said address select signal, wherein said first level converting circuit is activated in response to said address select signal having a first state and wherein said second level converting circuit is activated in response to said address select circuit having a second state different from said first state.

12. A non-volatile semiconductor memory, according to claim 11, wherein said each of said predecoders also includes a high voltage driver, coupled to said first and second level converting circuits, said high voltage driver providing a high voltage driver signal that varies according to said address select signal and wherein each of said predecoders also includes a low voltage driver, coupled to said first and second level converting circuits, said low voltage driver providing a low voltage driver signal that varies according to said address select signal.

13. A non-volatile semiconductor memory, according to claim 12, wherein each of said predecoders also includes a voltage switching circuit that provides as an output thereof one of: said positive voltage signal and said negative voltage signal, according to a mode select signal, and wherein each of said predecoders also includes a select address driver, coupled to said voltage switching circuit and to said first and second level converting circuits, said select address driver providing said output of said voltage switching circuit according to said high voltage driving signal and said low voltage driving signal.

14. A non-volatile semiconductor memory, according to claim 13, further comprising:
a reset driver, coupled to said select address driver and to a reset signal line, said reset driver causing said predecoder to output a signal different from both said positive driving voltage and said negative driving voltage in response to a reset signal being asserted on said reset signal line.

15. A non-volatile semiconductor memory, according to claim 6, wherein said positive driving voltage is provided in connection with an erase operation and wherein said negative driving voltage is provided in connection with a write operation.

16. A non-volatile semiconductor memory, according to claim 6, wherein said positive driving voltage is provided in connection a write operation and wherein said negative driving voltage is provided in connection with an erase operation.

17. A word line driver for a semiconductor memory, comprising:

an input line that receives a positive voltage select address signal;

an output that selectively provides said select address signal;

a first switch, coupled to said input line and said output, said first switch providing said select address signal at said output in response to a first switching signal and to said select address signal having a positive voltage; and a second switch, coupled to said input line and said output, said second switch providing said select address signal at said output in response to a second switching signal and to said select address signal having a negative voltage.

18. A word line driver, according to claim 17, wherein said first switch is connected in parallel to said second switch.

19. A word line driver, according to claim 17, further comprising:

a reset switch, coupled to said output of the word line driver and to a reset signal line, said reset switch providing a signal different from both said positive voltage signal and said negative voltage signal in response to receiving a reset signal being provided on said reset signal line.

* * * * *